United States Patent
Ebine et al.

(10) Patent No.: US 8,242,587 B2
(45) Date of Patent: Aug. 14, 2012

(54) ELECTRONIC DEVICE AND PRESSURE SENSOR

(75) Inventors: Hiromichi Ebine, Hitachinaka (JP);
Katsuhiko Kikuchi, Hitachinaka (JP);
Satoshi Shimada, Hitachinaka (JP);
Masahide Hayashi, Chiyoda-ku (JP)

(73) Assignees: Hitachi, Ltd., Tokyo (JP); Hitachi Car Engineering Co., Ltd., Hitachinaka-shi (JP)

( * ) Notice: Subject to any disclaimer, the term of this patent is extended or adjusted under 35 U.S.C. 154(b) by 539 days.

(21) Appl. No.: 12/177,210

(22) Filed: Jul. 22, 2008

(65) Prior Publication Data

US 2008/0283997 A1 Nov. 20, 2008

Related U.S. Application Data

(63) Continuation of application No. 10/855,344, filed on May 28, 2004, now Pat. No. 7,414,307.

(30) Foreign Application Priority Data

May 30, 2003 (JP) ................................. 2003-154273

(51) Int. Cl.
*H01L 23/31* (2006.01)
(52) U.S. Cl. ................................. 257/666; 257/E23.057
(58) Field of Classification Search ........................ None
See application file for complete search history.

(56) References Cited

U.S. PATENT DOCUMENTS

| | | | |
|---|---|---|---|
| 4,769,344 A | 9/1988 | Sakai et al. | |
| 5,386,730 A | 2/1995 | Ikeda et al. | |
| 5,399,905 A | 3/1995 | Honda et al. | |
| 5,459,350 A | 10/1995 | Date et al. | |
| 5,948,991 A | 9/1999 | Nomura et al. | |
| 5,986,316 A | 11/1999 | Toyoda et al. | |
| 6,050,146 A | 4/2000 | Nakamura et al. | |
| 6,214,634 B1 | 4/2001 | Osajda et al. | |
| 6,974,909 B2* | 12/2005 | Tanaka et al. | 174/529 |
| 7,732,919 B2* | 6/2010 | Shimizu et al. | 257/724 |
| 8,048,719 B2* | 11/2011 | Nishimura et al. | 438/121 |
| 2001/0020744 A1 | 9/2001 | Kuramoto et al. | |
| 2002/0063319 A1 | 5/2002 | Huang et al. | |
| 2003/0073349 A1 | 4/2003 | Nagao et al. | |
| 2003/0094050 A1* | 5/2003 | Miyazaki et al. | 73/753 |

FOREIGN PATENT DOCUMENTS

| | | |
|---|---|---|
| EP | 1312907 | 5/2003 |
| FR | 2748105 | 10/1997 |
| JP | 11-145180 | 5/1999 |

* cited by examiner

*Primary Examiner* — Benjamin Sandvik
(74) *Attorney, Agent, or Firm* — Crowell & Moring LLP

(57) ABSTRACT

An electronic device requires an electronic component to be mounted for the purpose of static shielding. The mounting of such an electronic component raises a problem of avoiding thermal stresses and cracks generated due to the difference between the coefficients of linear expansion of component materials. A positioning recess, a joining-substance thickness ensuring recess, a joining-substance thickness ensuring projection, etc. are formed in a combined manner in an electronic component mount portion of each of leads, whereby spreading of cracks generated in the joining substance can be suppressed and reliability can be improved. Filling a sealing material so as to seal and restrain the electronic component mounted in the electronic component mount portion without leaving voids contributes to further suppressing spreading of cracks generated in the joining substance and ensuring more improved reliability of the joining substance.

21 Claims, 6 Drawing Sheets

ELECTRONIC DEVICE AND PRESSURE SENSOR

CROSS REFERENCE TO RELATED APPLICATION

This application is a continuing application of U.S. application Ser. No. 10/855,344, filed May 28, 2004, which claims priority under 35 U.S.C. §119 to Japanese Patent Application No. 2003-154273, filed May 30, 2003, the entire disclosure of which are herein expressly incorporated by reference.

BACKGROUND OF THE INVENTION

1. Field of the Invention

The present invention relates to general electronic devices including an airflow sensor, a rotation signal sensor, an angle sensor, and an igniter, as well as a pressure sensor. More particularly, the present invention relates to a structure for mounting, in a package case integrally molded with leads, an electronic circuit for issuing an output signal and an electronic component for reducing an electric disturbance.

2. Description of the Related Art

As disclosed in JP-A-11-145180, there is known a method of preventing a position shift of an electronic component by forming a recess for positioning of the electronic component to be mounted.

On the other hand, for example, a capacitor with a lead wire is also known which is used as an electronic component for reducing an electric disturbance. However, such a capacitor has problems that its relatively bulky shape impedes a size reduction and the component is easily susceptible to an electric disturbance because the lead wire acts as an antenna. It is therefore desired to employ a smaller-sized device, e.g., a smaller-sized chip capacitor or chip inductor.

SUMMARY OF THE INVENTION

The above-mentioned known method is intended to form a recess for positioning of the electronic component to be mounted and it does not take into consideration a thickness of a joining substance. This has invited a problem of variations in thickness of the joining substance.

By experiments, it has been confirmed that, when an electronic component is mounted between leads integrally molded with a resin-made package case, cracks generate and spread in the joining substance due to thermal stresses caused based on the difference between the coefficients of linear expansions of component materials used. Because a spreading rate of the cracks is related to the thickness of the joining substance, controlling the thickness of the joining substance is important for the purpose of ensuring reliability in protection against the cracks.

Further, when an electronic component is bonded using a solder, which is one of joining substances, after bonding a sensor to a package case, the conventional reflow process has become difficult to implement for the reason that the melting point of the used solder tends to increase with the wider use of lead-free solders. In addition, because of a fear that the heat generated during the reflow step may damage the sensor, a joining process capable of protecting the sensor and the package case against thermal damages is demanded.

Accordingly, it is an object of the present invention to ensure a necessary thickness of a joining substance while preventing a position shift of a mounted electronic component, thereby increasing reliability in protection against cracks possibly generated by thermal stresses in a joined portion.

Another object of the present invention is to prevent a short-circuiting between wires while increasing reliability in protection against cracks.

The above objects are achieved by an electronic device in which a thickness of a joining substance for electrically bonding an electronic component is set to be not less than 70 μm.

Also, the above objects are achieved by a pressure sensor comprising a pressure sensing unit; a case in which the pressure sensing unit is disposed; terminals for outputting a signal from the pressure sensing unit to an external circuit; an electronic component; and a conductive substance for connecting the terminals and the electronic component to each other, wherein the conductive substance is formed to have a relatively thick portion and a relatively thin portion in conformity with a shape of at least one member adjacent to the conductive substance.

Further, the above objects are achieved by a pressure sensor comprising a pressure sensing unit; a resin case in which the pressure sensing unit is disposed; terminals integrally molded in the case and outputting a signal from the pressure sensing unit to an external circuit; and a conductive substance for connecting the terminals and the electronic component to each other, wherein the terminal has a recess having bottom surfaces with different depths, and the recess is used for positioning and bonding the electronic component.

DESCRIPTION OF THE PREFERRED EMBODIMENTS

The construction of one embodiment of the present invention will be described below with reference to FIGS. 1 and 2.

Figure 1:
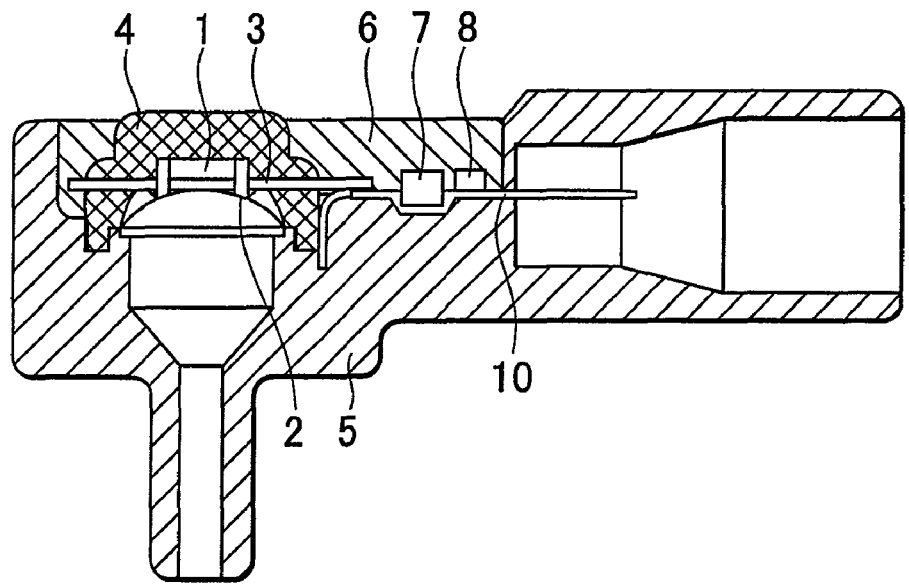
FIG. 1 is a longitudinal sectional view of a pressure sensor according to one embodiment of the present invention.
Figure 2:
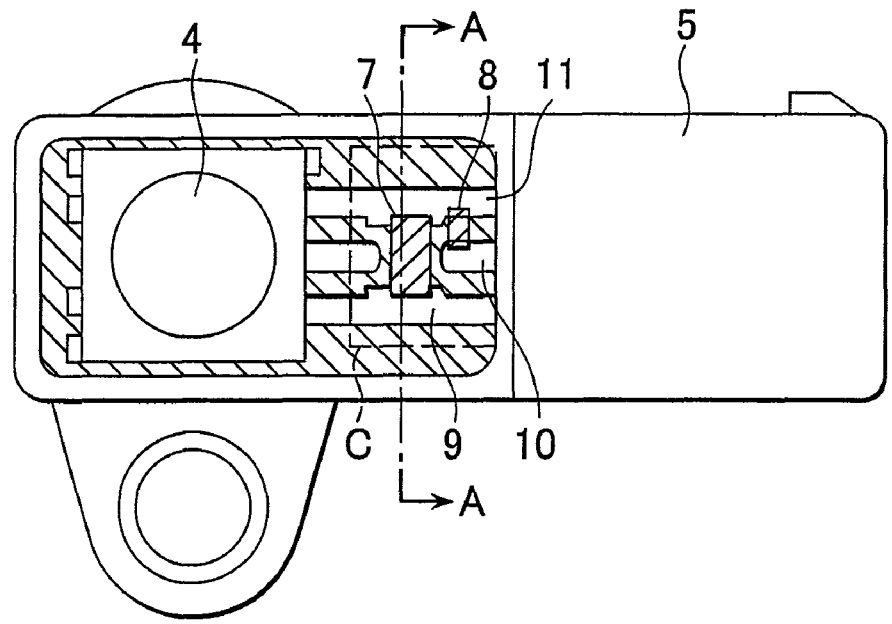
FIG. 2 is a front view of the pressure sensor according to one embodiment of the present invention.

FIG. 1 is a longitudinal sectional view of a pressure sensor according to one embodiment of the present invention, and FIG. 2 is a front view of the pressure sensor.

A sensing unit 1 is constructed by forming a diaphragm and a circuit on a silicon wafer and connecting the silicon wafer to a glass base by anodic bonding.

A sensing unit case 4 is made of thermosetting resin such as an epoxy resin or thermoplastic resin such as PPS (polyphenylene sulfide). Sensing unit terminals 3 are each made of phosphor copper plated with nickel.

The sensing unit 1 is fixedly bonded to the sensing unit case 4. The sensing unit terminals 3 and the sensing unit 1 both insert-molded in the sensing unit case 4 are connected to each other by connecting wires 2 of aluminum or gold for electrical connecting between them.

A package case 5 comprises a resin material, e.g., PBT (polybutylene terephthalate) or PPS, and metal-made leads 9, 10 and 11. The package case 5 has openings for mounting the sensing unit case 4 and electronic components 7, 8 therein, and its outer side portion is in the form of a connector for outputting a signal to an external circuit.

The sensing unit case 4 is mounted in the corresponding opening of the package case 5, and the sensing unit terminals 3 are connected to the leads 9, 10 and 11 by welding. Further, the electronic components 7, 8 are each bonded in straddling relation to all or two of the leads 9, 10 and 11 by using a joining substance 14, such as a solder or a conductive paste, for electrical connection therebetween. Then, a sealing material 6, e.g., an epoxy or silicone resin, is poured and hardened in the openings of the package case 5 without leaving any voids. A pressure sensor is thereby completed.

Features of the present invention will be described below with reference to FIGS. 3 to 12.

Figure 3:
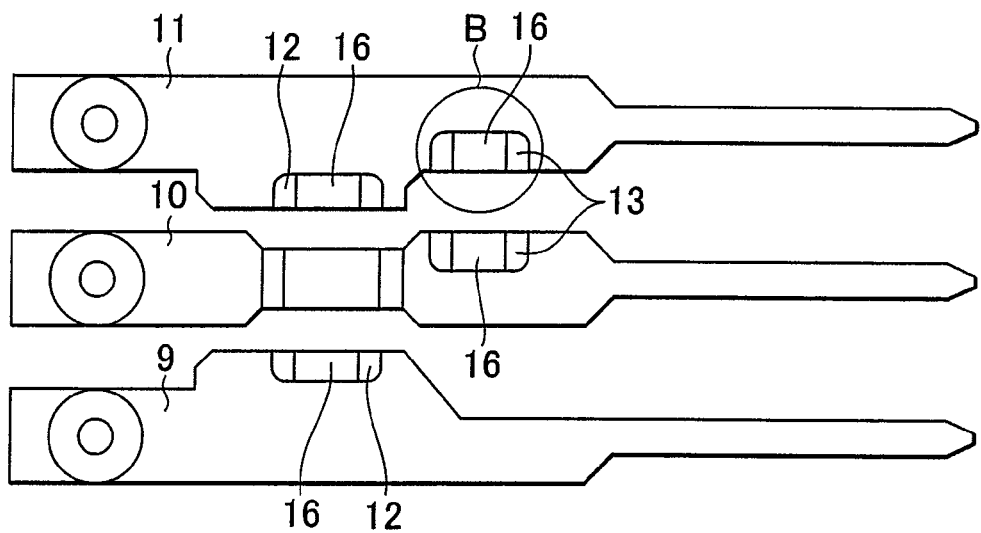
FIG. 3 shows only leads extracted from FIG. 2.

FIG. 3 shows only the leads 9, 10 and 11 extracted from FIG. 2.

In the leads 9, 10 and 11, there are formed, as shown, recesses 12, 13 for mounting the electronic components 7, 8 therein and recesses 16 formed in inner bottom portions of those recesses 12, 13 for ensuring a necessary thickness of the joining substance 14.

Figure 4:
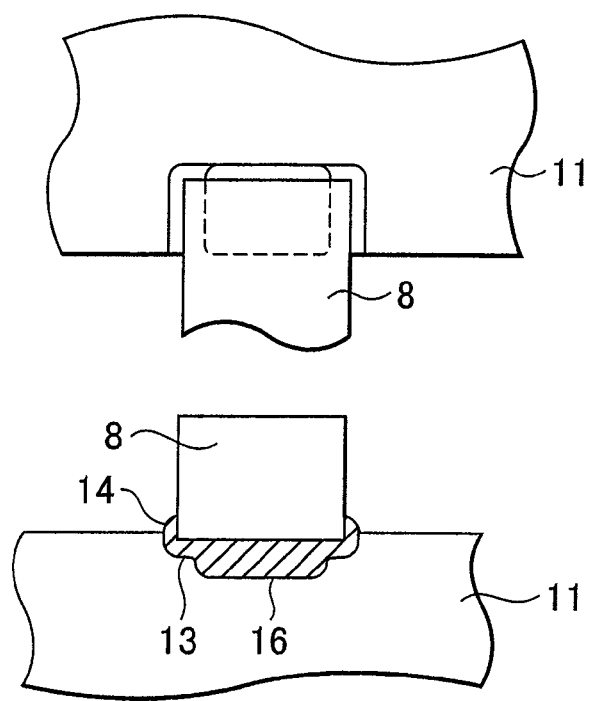
FIG. 4 is a detailed front view and side view of an electronic component mount portion and the surroundings thereof according to one embodiment of the present invention.

FIG. 4 is a detailed front view and side view showing a region B in FIG. 3 in a state of the electronic component 8 being mounted in the recess 13.

For the purpose of positioning the electronic component 8, the recess 13 is formed in a position of the lead 11 where the electronic component 8 is to be mounted, so as to receive the electronic component 8. In the bottom surface of the recess 13, the recess 16 is formed at a width smaller than that of the electronic component 8 for the purpose of ensuring a necessary thickness of the joining substance 14 made of a solder or a conductive paste. As a result, when the electronic component 8 is mounted, a position shift of the electronic component 8 can be prevented by the positioning recess 13, and a necessary minimum thickness of the joining substance 14 can be ensured by the joining-substance thickness ensuring recess 16.

Figure 5:
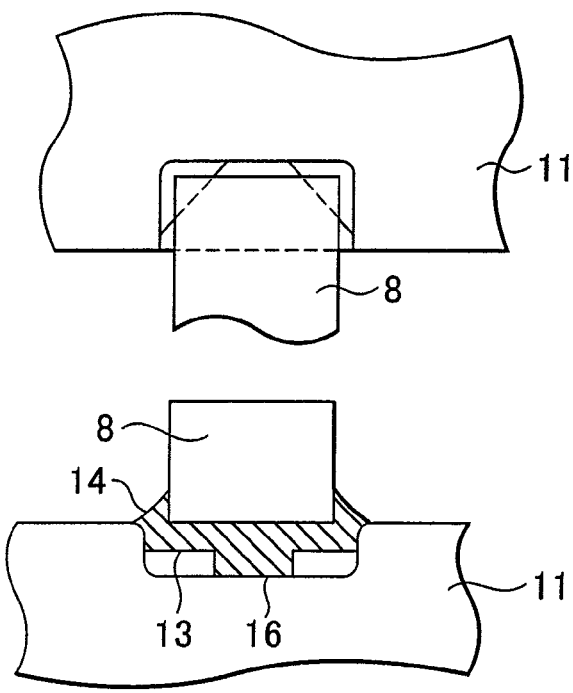
FIG. 5 is a detailed front view and side view of an electronic component mount portion and the surroundings thereof according to another embodiment of the present invention.

FIG. 5 shows another embodiment resulting from modifying the structure of FIG. 4 such that the joining-substance thickness ensuring recess 16 is formed in a shape leaving only bottom corners of the positioning recess 13 as they are. This embodiment can also provide similar advantages to those of the embodiment shown in FIG. 4 because the electronic component 8 is properly positioned at its corners by the corresponding bottom corners of the positioning recess 13.

Figure 6:
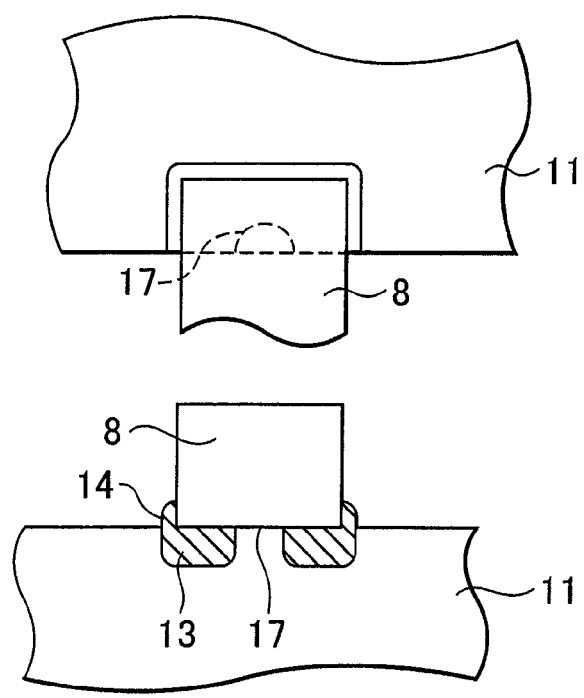
FIG. 6 is a detailed front view and side view of an electronic component mount portion and the surroundings thereof according to still another embodiment of the present invention.

FIG. 6 shows still another embodiment resulting from modifying the structure of FIG. 4 such that a projection 17 for ensuring a necessary thickness of the joining substance is provided. This embodiment can also provide similar advantages to those of the embodiment shown in FIG. 4 because the electronic component 8 is supported by the joining-substance thickness ensuring projection 17.

The joining-substance thickness ensuring projection 17 may be provided in plural.

Figure 7:
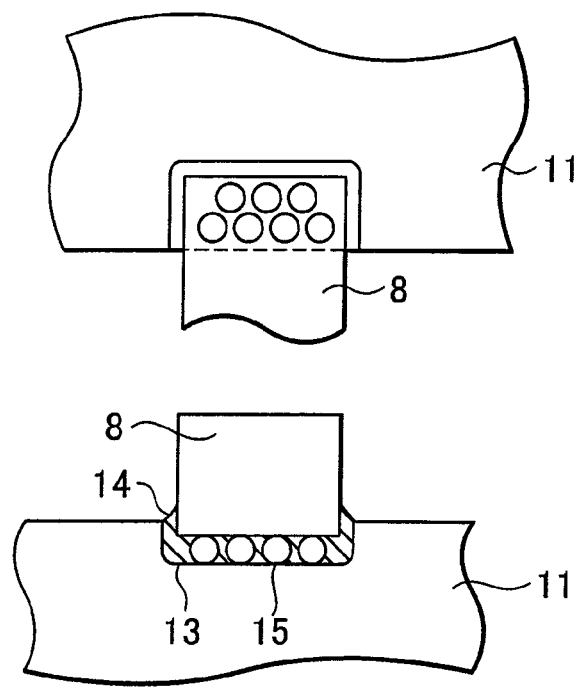
FIG. 7 is a detailed front view and side view of an electronic component mount portion and the surroundings thereof according to still another embodiment of the present invention.

FIG. 7 shows still another embodiment resulting from modifying the structure of FIG. 4 such that the positioning recess 13 is formed at a depth larger than the necessary thickness of the joining substance 14, and conductive solids 15 each having a size corresponding to the necessary thickness of the joining substance 14 are mixed in the joining substance 14 when the joining substance 14 is applied for bonding of the electronic component 8. This embodiment can also provide similar advantages to those of the embodiment shown in FIG. 4 because the electronic component 8 is supported by the conductive solids 15 mixed in the joining substance 14.

Figure 8:
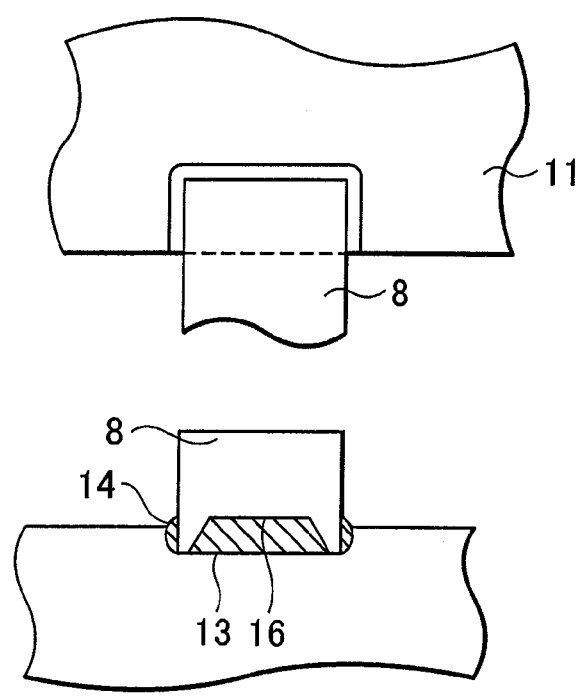
FIG. 8 is a detailed front view and side view of an electronic component mount portion and the surroundings thereof according to still another embodiment of the present invention.

FIG. 8 shows still another embodiment resulting from modifying the structure of FIG. 4 such that the joining-substance thickness ensuring recess 16 is formed by etching, for example, in a bonding surface of the electronic component 8 to be mounted. Alternatively, similar advantages can also be obtained by providing a projection on the bonding surface of the electronic component 8 as in the embodiment described above with reference to FIG. 6.

Figure 9:
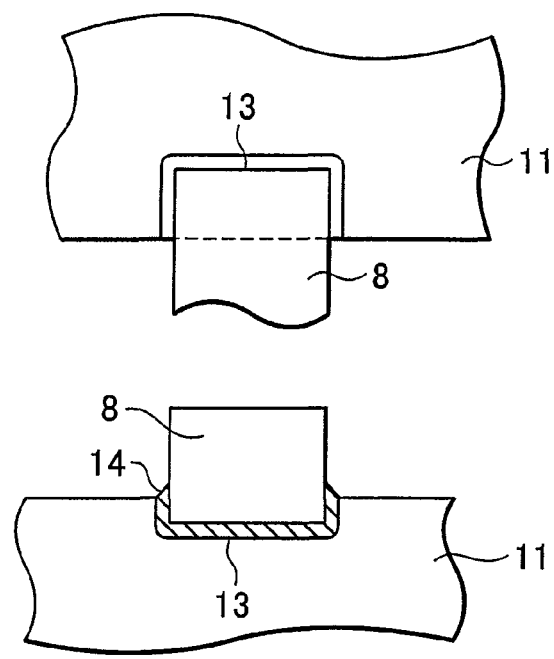
FIG. 9 is a detailed front view and side view of an electronic component mount portion and the surroundings thereof according to related art.

FIG. 9 shows the related art in which only the positioning recess 13 is formed and the electronic component 8 is bonded by using the joining substance 14. With the structure of the related art, the thickness of the joining substance 14 has large variations and is difficult to control based on only work conditions because the thickness is decided depending on the surface tension developed when the joining substance 14 is molten and hardened.

Figure 10:
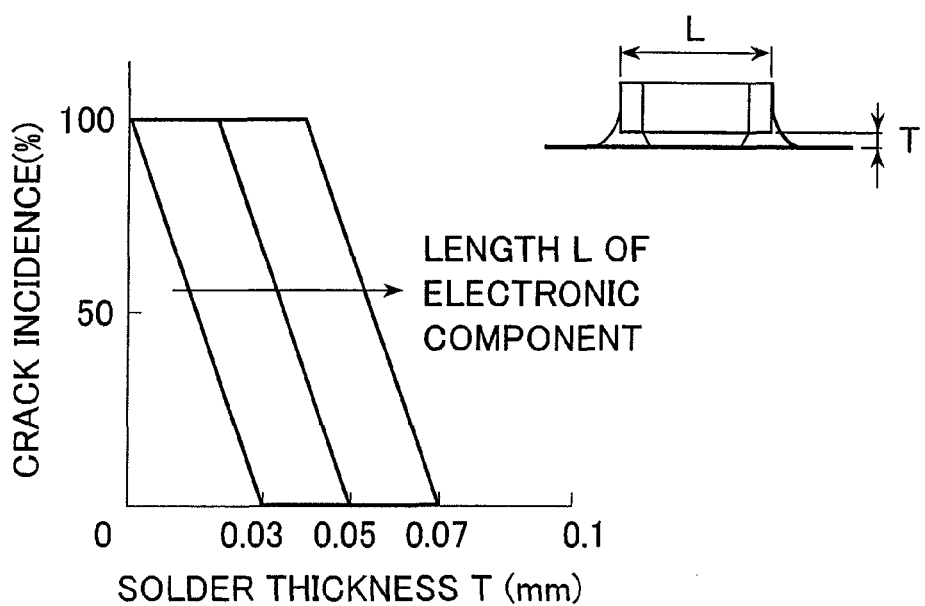
FIG. 10 is a graph showing the relationship between a thickness of a joining substance and an incidence of cracks generated in the joining substance in one embodiment of the present invention after an endurance test.

FIG. 10 is a graph showing the relationship between a thickness T of a solder and an incidence of cracks generated in the solder, which was experimentally obtained after carrying out a cold-hot cycle endurance test with the solder used as the joining substance 14 in one embodiment of the present invention.

Thermal stresses are repeatedly caused due to the difference between the coefficients of linear expansion of component materials, whereby cracks generate and spread in the solder.

The experiment results show a tendency that the crack incidence after the endurance test reduces as the thickness T of the solder increases. Also, a longer solder thickness T is required for prevention of cracks as a length L of the electronic component increases. In this embodiment, for the electronic components 7 and 8 having the longest size in their specifications, the solder thickness capable of preventing cracks after the endurance test is required to be not less than 70 μm.

With this embodiment, it is possible to control the thickness of the joining substance 14, which affects reliability of the joined portion, and to ensure improved reliability.

Figure 11:
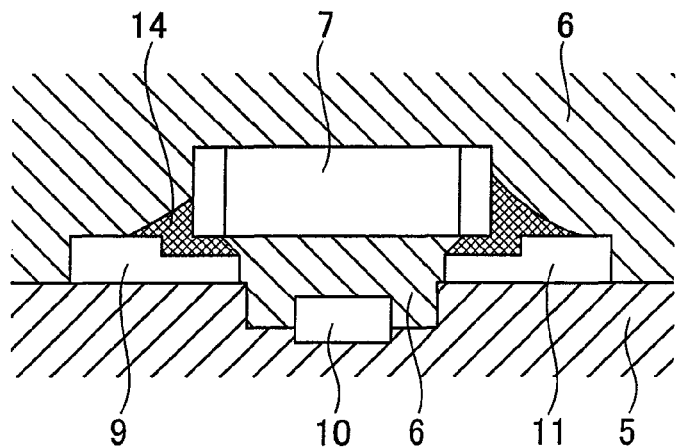
FIG. 11 is a detailed sectional view of the electronic component mount portion and the surroundings thereof according to one embodiment of the present invention.

FIG. 11 is a sectional view taken along the line A-A in FIG. 2. The electronic component 7, such as a chip capacitor, is bonded using the joining substance 14 onto the leads 9, 11 integrally molded in the package case 5. By mold-sealing such a component with the sealing material 6 having the coefficient of linear expansion smaller than that of the package case 5, but larger than that of the electronic component 7 without leaving voids, it is possible to restrain thermally induced displacements, to suppress spreading of cracks generated in the joining substance 14, and to ensure further improved reliability. Also, in the case of using a solder as the joining substance 14, the use of the sealing material 6 having properties capable of dissolving solder flux precipitated on the surface of the joining substance 14, the sealing material 6 can be more positively joined to each component, and the thermally induced displacements can be restrained. Further, by filling the sealing material 6 in each space between adjacent two of the leads 9, 10 and 11 without leaving voids, a short-circuiting can be prevented from occurring due to deformation and growth of the joining substance 14 with time-dependent changes.

Figure 12:
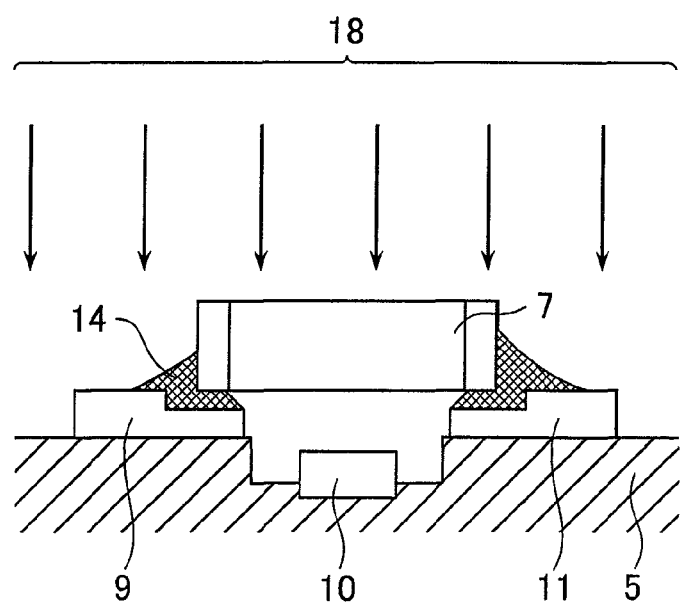
FIG. 12 is a detailed sectional view showing a step of bonding the electronic component according to one embodiment of the present invention.

FIG. 12 is a sectional view, taken along the line A-A in FIG. 2, showing a step of bonding the electronic component 7 with the solder used as the joining substance 14. In a manner shown in FIG. 12, a light 18 is illuminated to bond the electronic component 7 by using the solder as the joining substance 14. By illuminating the light 18 to an only region indicated by C in FIG. 2, it is possible to melt the solder without thermally damaging the package case 5 and the sensing unit 1. Further, by uniformly illuminating the light 18 to the region indicated by C in FIG. 2 where the electronic components 7 and 8 are included, the solder bonding can be stably performed while avoiding damages of the electronic components 7 and 8, which are otherwise caused by local overheating upon illumination of, e.g., a laser spot.

In short, providing an additional recess or projection besides the positioning recess in an electronic component mount portion enables the thickness of the joining substance to be controlled, and therefore results in an advantage of ensuring satisfactory reliability of the joining substance.

Also, filling the sealing material so as to seal and restrain the electronic component mounted in the electronic component mount portion without leaving voids results in advantages of suppressing spreading of cracks generated in the joining substance, preventing a short-circuiting between the leads otherwise caused by deformation and growth of the joining substance, and ensuring more satisfactory reliability of the joining substance.

Further, when a solder is used as the joining substance, the use of a light illuminating process for melting the solder results in an advantage of enabling the electronic component to be bonded without damaging the sensing unit and the package case.

Thus, according to the present invention, it is possible to improve reliability in protection against cracks and to prevent a short-circuiting between the leads.

What is claimed is:

1. A pressure sensor comprising:
   pressure sensing unit;
   a resin case in which said pressure sensing unit is disposed;
   a plurality of integrally molded leads, one-end portion of said leads configured as connector terminals for electrical connection to an external circuit such that a signal from said pressure sensing unit can be output via said terminals of said leads; and
   an electric component which is connected to a first lead and a second lead by a joining substance at an opening portion of said resin case;
   wherein a solder recess of varying depth is provided at first and second leads at a location at which said electric component is connected, the solder being located between said electric component and said recess at a position opposite to and countering the bottom of the electric component; and
   wherein the electric component is connected to the first lead and second lead by the joining substance.

2. A pressure sensor according to claim 1,
   wherein said pressure sensing unit is formed with a silicon wafer forming a diaphragm and a circuit, a sensing unit case on which said silicon wafer is fixed, sensing unit terminals insert-molded in said sensing unit case and connecting wires which connects said sensing unit terminal and said circuit electrically, and
   said sensing unit terminals and said leads are connected respectively at said opening portion.

3. A pressure sensor according to claim 1, further comprising a sealing material which is provided for sealing said opening portion.

4. A pressure sensor according to claim 2, further comprising a sealing material which is provided for sealing said opening portion.

5. A pressure sensor according to claim 1, further comprising a third lead between said first lead and said second lead is crossed under said electric component and is unconnected to said electric component.

6. A pressure sensor according to claim 1, wherein, in said recess on said first lead and said second lead, an electric component positioning recess which is formed for surrounding said electric component, and a thickness ensuring recess which is provided inside of said electric component positioning recess are formed.

7. A pressure sensor according to claim 1, wherein, in said recess on said first lead and said second lead, an electric component positioning recess which is formed for surrounding said electric component and a projection at a bottom of said electric component positioning recess are formed.

8. A pressure sensor according to claim 1, wherein said joining substance is a solder, and said electric component is a chip capacitor.

9. A pressure sensor according to claim 1, wherein said pressure sensing unit is formed with a silicon wafer forming a sensing portion and a circuit.

10. An electric device comprising:
    a semiconductor electric component;
    a resin case in which said semiconductor electric component is disposed;
    a plurality of integrally molded leads, one-end portion of said leads configured as connector terminals for electrical connection to an external circuit such that a signal from said semiconductor electric component can be output via said terminals of said leads; and
    an electric component which is connected to a first lead and a second lead by a joining substance at an opening portion of said resin case;
    wherein a recess for solder of varying depth is provided at first and second leads at a portion on which said electric component is connected, the solder being located between said electric component and said recess at a position opposite to and countering the bottom of the electric component; and
    the electric component is connected to the first lead and second lead at the position of the two recesses by the joining substance.

11. An electric device according to claim 10,
wherein said semiconductor electric component is formed with a silicon wafer forming a diaphragm and a circuit, a unit case on which said silicon wafer is fixed, unit terminals insert-molded in said unit case and connecting wires which connects said unit terminal and said circuit electrically, and
said unit terminals and said leads are connected respectively at said opening portion.

12. An electric device according to claim 10, further comprising a sealing material which is provided for sealing said opening portion.

13. An electric device according to claim 11, further comprising a sealing material which is provided for sealing said opening portion.

14. An electric device according to claim 10, further comprising a third lead which is existed between said first lead and said second lead, is crossed under said electric component, and is unconnected to said electric component.

15. An electric device according to claim 10, wherein, in said recess which is provided on said first lead and said second lead, an electric component positioning recess surrounding said electric component and a thickness ensuring recess inside said electric component positioning recess are formed.

16. An electric device according to claim 10, wherein, in said recess on said first lead and said second lead, an electric component positioning recess surrounding said electric component and a projection at a bottom of said electric component positioning recess are formed.

17. An electric device according to claim 10, wherein said joining substance is a solder, and said electric component is a chip capacitor.

18. A pressure sensor according to claim 1, wherein the electric component positioning recess which is formed at the position which counters the center bottom of the electric component, and a thickness ensuring recess which is provided for surrounding the electric component positioning recess are formed.

19. A pressure sensor according to claim 1, wherein a thickness of said joining substances which are located between said first lead and said electric component and between said second lead and said electric component is a minimum of 70 µm.

20. An electric device according to claim 10, wherein the electric component positioning recess is arranged to centrally receive the bottom region of the electric component, and a thickness ensuring recess is configured to surround the electric component positioning recess are formed.

21. An electric device according to claim 10, wherein a thickness of said joining substances which are located between said first lead and said electric component and between said second lead and said electric component is a minimum of 70 µm.

* * * * *